United States Patent
Hu et al.

(10) Patent No.: US 9,057,805 B2
(45) Date of Patent: Jun. 16, 2015

(54) LENS AND LED UNIT USING THE SAME

(71) Applicant: HON HAI PRECISION INDUSTRY CO., LTD., New Taipei (TW)

(72) Inventors: Chau-Jin Hu, New Taipei (TW); Feng-Yuen Dai, New Taipei (TW); Po-Chou Chen, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 14/010,552

(22) Filed: Aug. 27, 2013

(65) Prior Publication Data
US 2015/0041838 A1    Feb. 12, 2015

(30) Foreign Application Priority Data
Aug. 7, 2013  (TW) .............................. 102128201 A

(51) Int. Cl.
*H01L 33/00* (2010.01)
*G02B 3/00* (2006.01)
*H01L 33/58* (2010.01)

(52) U.S. Cl.
CPC . *G02B 3/00* (2013.01); *H01L 33/58* (2013.01)

(58) Field of Classification Search
CPC ......... H01L 33/60; H01L 33/20; H01L 33/62; H01L 33/54; H01L 33/58
USPC ....................................... 257/81, 98, 99, 100
See application file for complete search history.

(56) References Cited

U.S. PATENT DOCUMENTS 7,898,711 B2 *  3/2011  Kato .......................... 359/207.5
2014/0043840 A1 *  2/2014  Zwick et al. .................. 362/516

* cited by examiner

*Primary Examiner* — Quoc Hoang
(74) *Attorney, Agent, or Firm* — Novak Druce Connolly Bove + Quigg LLP

(57) ABSTRACT

A lens includes a bottom face, a light incident face defined in the bottom face, two opposite first lateral faces, two opposite second lateral faces and a light emerging face. The two first lateral faces are located adjacent to the light incident face, and the two second lateral faces are located away from the light incident face. The light emerging face includes two convex faces and a concave face interconnecting the two convex faces. The light emerging face has a light diverging capability along a first direction larger than that along a second direction perpendicular to the first direction.

17 Claims, 5 Drawing Sheets

LENS AND LED UNIT USING THE SAME

BACKGROUND

1. Technical Field

The disclosure generally relates to lenses, and more particularly to a lens having a substantially rectangular light pattern and an LED (light emitting diode) unit incorporating the lens.

2. Description of Related Art

Nowadays LEDs (light emitting diodes) are applied widely in various applications for illumination. The LED is a highly pointed light source. Thus, light directly emitted from the LED may form a small light spot. However, the small light spot can only illuminate a small area. In order to achieve a large illumination area, a large number of LEDs are required to be incorporated in a lamp, thereby resulting in a high cost of the lamp.

What is needed, therefore, is a lens and an LED unit using the lens which can address the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the various views.

DETAILED DESCRIPTION

Figure 1:
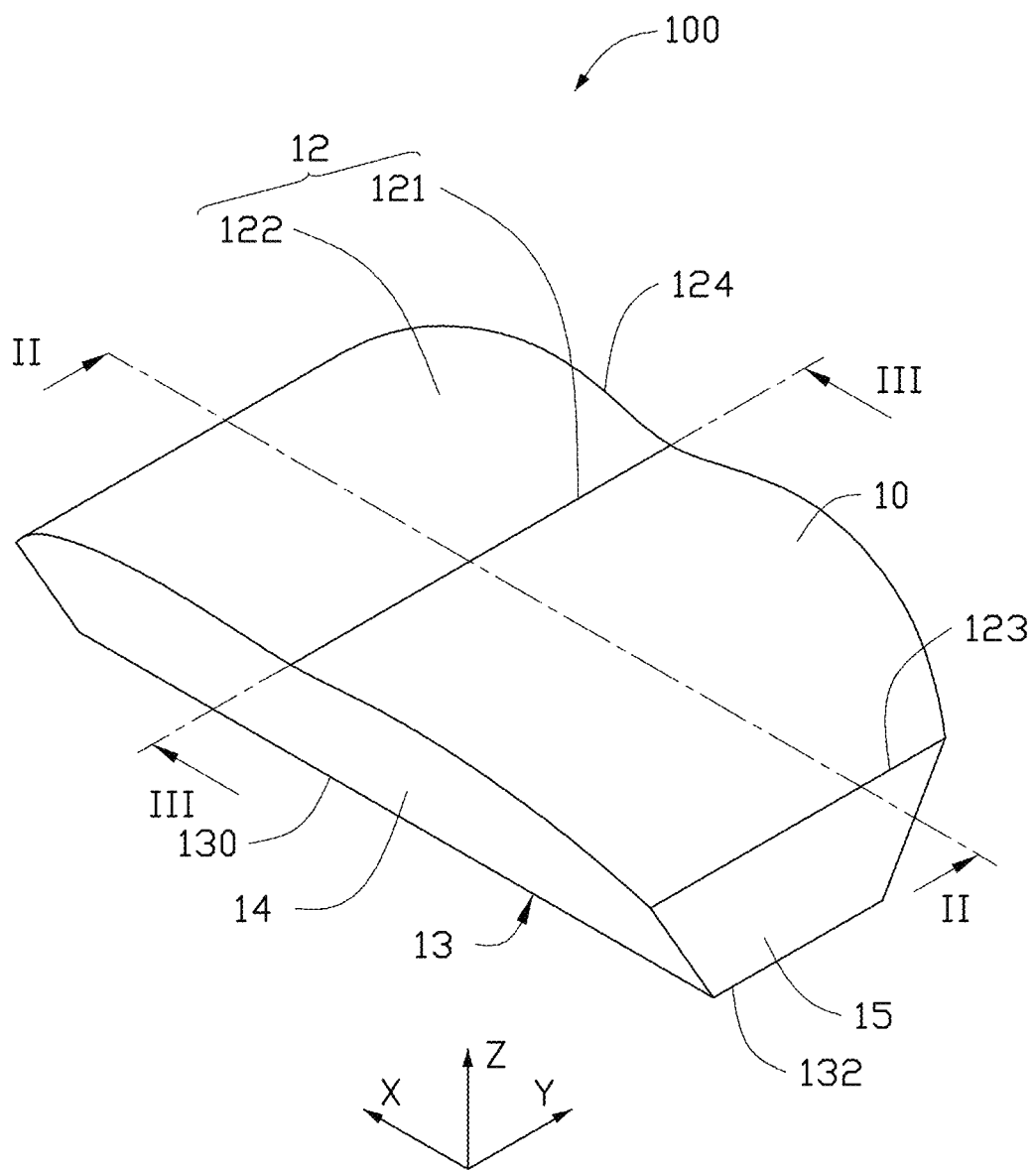
FIG. 1 shows an LED unit in accordance with an embodiment of the present disclosure.
Figure 2:
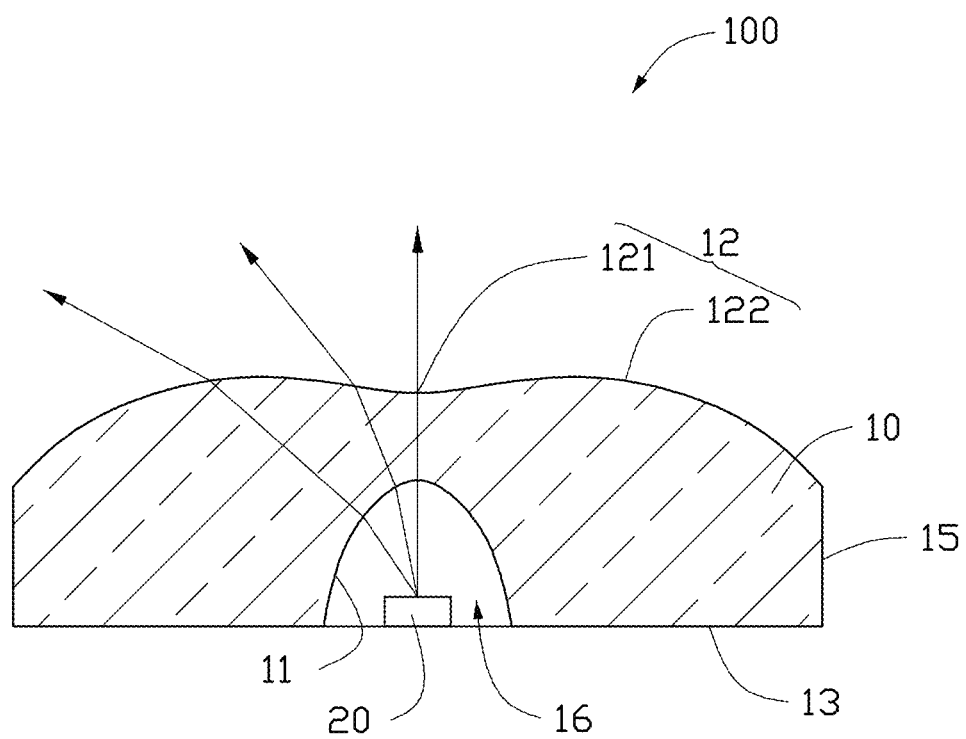
FIG. 2 shows a cross section of the LED unit of FIG. 1 taken along ling II-II thereof.

Referring to FIGS. 1-2, an LED unit 100 in accordance with an embodiment of the present disclosure is shown. The LED unit 100 includes an LED 20 and a lens 10 covering the LED 20.

The LED 20 may be made of GaN, InGaN, AlInGaN or other suitable semiconductor materials. The LED 20 can emit visible light when powered. The LED 20 may also have phosphor incorporated therein. Thus, the light emitted from the LED 20 can be changed by the phosphor to have a desired color.

Figure 3:
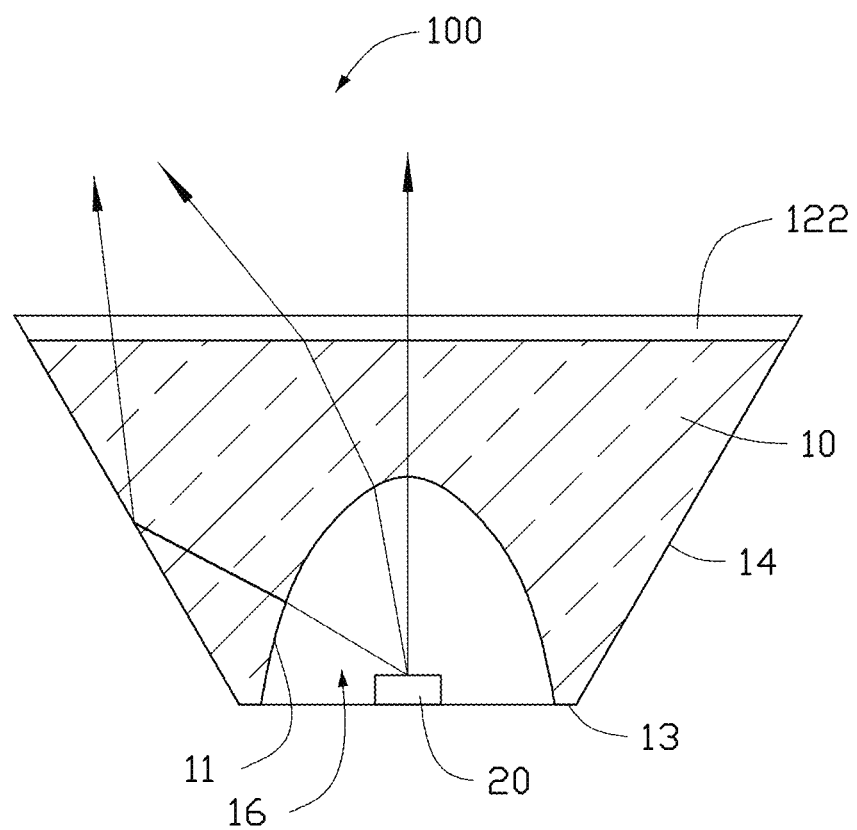
FIG. 3 shows a cross section of the LED unit of FIG. 1 taken along line III-III thereof.

Also referring to FIG. 3, the lens 10 may be made of transparent material such as glass, epoxy, silicone or the like. The lens includes a bottom face 13, a light incident face 11 formed in the bottom face 13, a light emerging face 12 opposite to the bottom face 13, two opposite first lateral faces 14 and two opposite second lateral faces 15 interconnecting the bottom face 13 and the light emerging face 12.

The bottom face 13 is a rectangular face. The bottom face 13 has two long edges 130 extending along and parallel to an X axis, and two short edges 132 extending along and parallel to a Y axis perpendicular to the X axis. The light incident face 11 is located at a central area of the bottom face 13. The light incident face 11 acts as a light diverging face for diverging the light entering the lens 10 from the LED 20. In this embodiment, the light incident face 11 is an elliptical face. A long axis of the elliptical face is overlapped with an optical axis of the lens 10, a short axis of the elliptical face is located within the bottom face 13. A cavity 16 is enclosed by the light incident face 11. The cavity 16 has a diameter gradually decreasing along a Z axis which is perpendicular to a plane defined by the X axis and the Y axis. In other words, the diameter of the cavity 16 gradually increases from a point of intersection of the Z axis and the light incident face 11 to the bottom face 13.

The light emerging face 12 is located above the bottom face 13. The emerging face 12 is formed by extending a curve in a plane defined by the X axis and the Z axis along the Y axis. The light emerging face 12 includes two convex faces 122 and a concave face 121 interconnecting the two convex faces 122. The two convex faces 122 are symmetrical with each other about the concave face 121. The two convex faces 122 and the concave face 121 are parallel to and juxtaposed with each other. The two convex faces 122 and the concave face 121 each extend along the Y axis. The light emerging face 12 is bumpy along the X axis, and flat along the Y axis. In other words, the light emerging face 12 has a varied curvature along the X axis, and a constant curvature along the Y axis. The light emerging face 12 includes two opposite short edges 123 and two opposite long edges 124 interconnecting the two short edges 123. The two short edges 123 are straight and parallel to each other, and the two long edges 124 are curved and parallel to each other. Each long edge 124 extends along the X axis, and each short edge 123 extends along the Y axis. The two long edges 124 have the same shape and length. That is to say, projections of the two long edges 124 on the plane defined by the X axis and the Z axis are totally overlapped with each other. Furthermore, any cross section of the light emerging face 12 taken in parallel to the plane defined by the X axis and the Z axis has the same shape as each long edge 124. The two short edges 123 also have the same shape and length. The light emerging face 12 can further diverge the light from an interior of the lens 10. A diverging capability of the light emerging face 12 along the X axis is larger than that along the Y axis.

Figure 4:
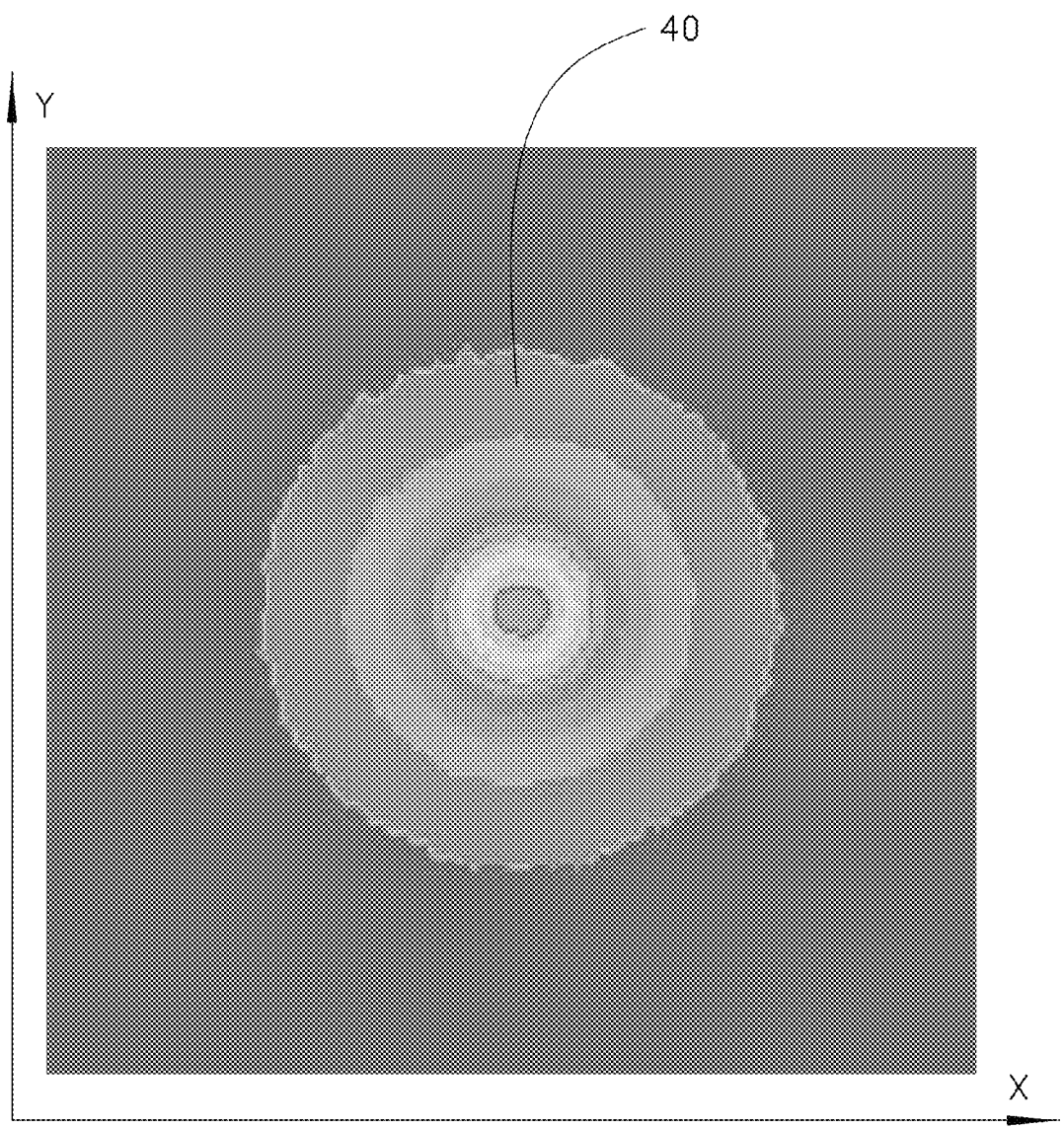
FIG. 4 shows a light pattern of an LED of the LED unit of FIG. 1 without being modulated by a lens.
Figure 5:
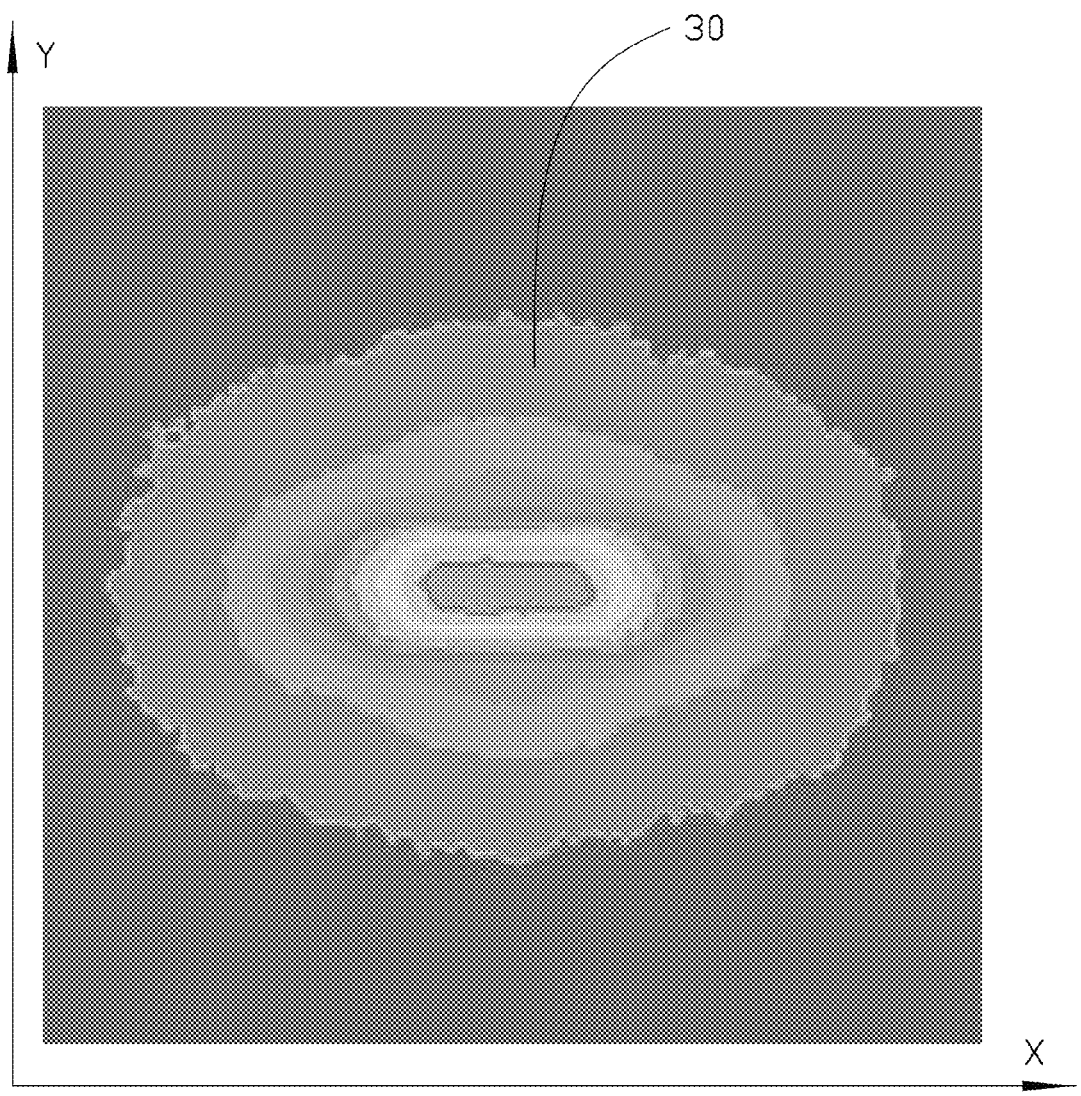
FIG. 5 shows a light pattern of the LED unit of FIG. 1.

The two first lateral faces 14 each extend upwardly and inclinedly from the long edge 130 of the bottom face 13 to the long edge 124 of the light emerging face 12. The two second lateral faces 15 each extend upwardly from the short edge 132 of the bottom face 13 to the short edge 123 of the light emerging face 12. Each first lateral face 14 is inclined relative to the bottom face 13, and each second lateral face 15 is perpendicular to the bottom face 13. The first lateral faces 14 are located adjacent to the light incident face 11. A large part of the light transmitting from the light incident face 11 will be totally reflected by the first lateral faces 14 along the Y axis (i.e., at any plane parallel to a plane defined by the Y axis and the Z axis), thereby being converged towards the light emerging face 12. The light emerging face 12 further diverges the converged light to an outside environment along the Y axis (i.e., at any plane parallel to the plane defined by the Y axis and the Z axis). Since most of the light emitted from the LED 20 is sequentially diverged by the light incident face 11, converged by the first lateral faces 14 and diverged by the light emerging face 12 along the Y axis, the light emitting out of the lens 10 does not have a large light emerging angle along the Y axis. The second lateral faces 15 are located away from the light incident face 11. A relatively small part of the light transmitting from the light incident face 11 will strike the second lateral faces 15 along the X axis (i.e., at any plane parallel to the plane defined by the X axis and the Z axis). A large part of the light transmitting from the light incident face 11 directly passes through the light emerging face 12 and is diverged to the outside environment along the X axis (i.e., at any plane parallel to the plane defined by the X axis and the Z axis). Since most of the light emitted from the LED 20 is sequentially diverged by the light incident face 11 and the light emerging face 12 along the X axis, the light emitting out of the lens 10 has a large light emerging angle along the X axis. Thus, a light pattern 30 of the LED unit 20 is long along the X axis, and short along the Y axis as shown in FIG. 5. Compared with a light pattern 40 without being modulated by the lens 10 as shown in FIG. 4, the light pattern 30 modulated by the lens 10 has a wider illumination area. Therefore, less LEDs 20 can be used even a large illumination area is required.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A lens comprising:
   a light incident face;
   two opposite first lateral faces extending along a first direction;
   two opposite second lateral faces extending along a second direction, the two opposite first lateral faces being located adjacent to the light incident face, and the two opposite second lateral faces being located away from the light incident face;
   a light emerging face comprising two convex faces and a concave face between the two convex faces, the two convex faces and the concave face extending along the second direction, and the light emerging face having a light diverging capability along the first direction larger than that along the second direction, the light emerging face comprising two parallel long edges and two parallel short edges, the two long edges extending along the first direction, and the two short edges extending along the second direction; and
   a bottom face opposite to the light emerging face with the light incident face defined therein;
   wherein each first lateral face is inclined relative to the bottom face, and each second lateral face is perpendicular to the bottom face.

2. The lens of claim 1, wherein the first direction is perpendicular to the second direction.

3. The lens of claim 1, wherein the two convex faces and the concave face are parallel to each other.

4. The lens of claim 1, wherein the light emerging face is bumpy along the first direction, and flat along the second direction.

5. The lens of claim 1, wherein the light emerging face has a varied curvature along the first direction, and a constant curvature along the second direction.

6. The lens of claim 1, wherein each long edge of the light emerging face is curved, and each short edge of the light emerging face is straight.

7. The lens of claim 6, wherein the two long edges of the light emerging face have the same shape and length, and the two short edges of the light emerging face have the same shape and length.

8. The lens of claim 1, wherein the light incident face is defined in a central area of the bottom face.

9. The lens of claim 8, wherein each first lateral face directly connects the bottom face with a corresponding long edge of the light emerging face, and each second lateral face directly connects the bottom face with a corresponding short edge of the light emerging face.

10. The lens of claim 8, wherein the bottom face is a substantially rectangular face.

11. The lens of claim 1, wherein each first lateral face has an area larger than that of each second lateral face.

12. An LED (light emitting diode) unit comprising:
    an LED emitting light; and
    a lens covering the LED, the lens comprising:
       a light incident face confronting the LED, the light entering the lens through the light incident face;
       two first lateral faces adjacent to the light incident face;
       two second lateral faces away from the light incident face;
       a bottom face opposite to the light emerging face with the light incident face defined therein; and
       a light emerging face having a light diverging capability along a first direction larger than that along a second direction perpendicular to the first direction;
    wherein the light from the light incident face, is diverged by the light emerging face to emit out of the lens along the first direction, and is converged by the two first lateral faces and then diverged by the light emerging face to emit out of the lens along the second direction, thereby obtaining a light pattern which is long along the first direction and short along the second direction; and
    wherein each first lateral face is inclined relative to the bottom face, and each second lateral face is perpendicular to the bottom face.

13. The LED unit of claim 12, wherein the light emerging face comprises two convex faces and a concave face interconnecting the two convex faces, the two convex faces and the concave face being parallel to each other.

14. The LED unit of claim 12, wherein the light emerging face is bumpy along the first direction, and flat along the second direction.

15. The LED unit of claim 12, wherein the light emerging face has a varied curvature along the first direction, and a constant curvature along the second direction.

16. The LED unit of claim 12, wherein the lens further comprises a bottom face opposite to the light emerging face, the two first lateral faces and the two second lateral faces connecting the bottom face with the light emerging face.

17. The LED unit of claim 12, wherein each first lateral face has an area larger than that of each second lateral face.

* * * * *